United States Patent

[19]

Mons

[11] Patent Number: 6,047,397
[45] Date of Patent: *Apr. 4, 2000

[54] READ DEVICE FOR A RECORD CARRIER

[75] Inventor: Johannes J. Mons, Eindhoven, Netherlands

[73] Assignee: U.S. Philips Corporation, New York, N.Y.

[*] Notice: This patent is subject to a terminal disclaimer.

[21] Appl. No.: 09/136,650

[22] Filed: Aug. 19, 1998

Related U.S. Application Data

[63] Continuation of application No. 08/389,369, Feb. 16, 1995, Pat. No. 5,838,696.

[30] Foreign Application Priority Data

Feb. 16, 1994 [EP] European Pat. Off. ............. 94200339

[51] Int. Cl.[7] ................................................ G11C 29/00
[52] U.S. Cl. .......................................... 714/763; 714/752
[58] Field of Search ................................... 714/763, 752, 714/758

[56] References Cited

U.S. PATENT DOCUMENTS

| | | | |
|---|---|---|---|
| 4,760,576 | 7/1988 | Sako ........................................ | 714/755 |
| 4,788,685 | 11/1988 | Sako et al. ............................... | 714/756 |
| 4,802,152 | 1/1989 | Markvoort et al. ....................... | 369/32 |
| 4,949,326 | 8/1990 | Takagi et al. ............................ | 369/54 |
| 5,200,943 | 4/1993 | Sano et al. ............................... | 369/48 |
| 5,263,030 | 11/1993 | Rotker et al. ............................ | 714/762 |
| 5,381,422 | 1/1995 | Shimizu ................................... | 714/755 |
| 5,400,347 | 3/1995 | Lee .......................................... | 714/756 |
| 5,408,478 | 4/1995 | Ohmori et al. ........................... | 714/756 |
| 5,499,252 | 3/1996 | Watanabe ................................. | 714/769 |
| 5,517,484 | 5/1996 | Takagi et al. ............................ | 369/275.3 |
| 5,838,696 | 11/1998 | Mons ....................................... | 714/763 |

*Primary Examiner*—Albert De Cady
*Assistant Examiner*—Shelly A Chase
*Attorney, Agent, or Firm*—Leroy Eason

[57] ABSTRACT

A read device for reading a record carrier which has recorded thereon a data signal which represents data words, added codewords of a first type and added codewords of a second type. The added codewords of the first type have a predefined first relation to the data words, and the added codewords of the second type have a second predefined relation to the data words and the added codewords of the first type. The added codewords of both types enable error correction according to a given algorithm. The data signal is divided into blocks which each contain a control portion which includes control words and a data portion which includes user-supplied data words. The data words and added first and second type codewords are ordered and interrelated so that the order of the data words is not altered by error correction according to the given algorithm, and the second-type codewords are located closer to the related control data words than are the first-type codewords. The read device includes first and second decoders (45, 47) for correcting errors in the data words respectively in response to the added second type and first type codewords. The read device further includes means for deriving control words from the control portions of the data signal blocks, which control words have either not been error corrected or have been error corrected solely in response to second type codewords. The control portions may include sector address information, and so can be used for rapid block searching.

3 Claims, 2 Drawing Sheets

| Pos | +0 | +1 | +2 | +3 | Size | |
|---|---|---|---|---|---|---|
| 0 | SYNC | | | | 4 | |
| 4 | CRC | | | Pos_in_Cluster | 8 | } 20 |
| | Subcode | | | | | |
| 12 | Address | | | Mode | 4 | |
| 16 | Sub- | | | | 8 | |
| 20 | Header | | | | | |
| 24 | User Data | | | | 2048 | } 21 |
| 2072 | EDC | | | | 4 | |
| 2076 | Reserved | | | | 4/12 | |
| | Total: | | | | 2080/ 2088 | |

READ DEVICE FOR A RECORD CARRIER

This is a continuation of application Ser. No. 08/389,369, filed Feb. 16, 1995 U.S. Pat. No. 5,838,696.

BACKGROUND OF THE INVENTION

1. Field of the Invention

The invention relates to a read device for a record carrier on which is recorded a data signal representing data words, added codewords of a first type and added codewords of a second type, the added codewords of the first type having a predefined first relation to the data words, and the added codewords of the second type having a second predefined relation to the data words and the added codewords of the first type. The first and second relations determine a preliminary error correction. The data signal is subdivided into blocks which each comprise a control portion containing control data and a data portion containing user-supplied data.

Such a record carrier and device are known, for example, by the name of CD-ROM and CD-ROM player.

2. Description of the Related Art

The user-supplied data on a CD-ROM is recorded in a so-termed main channel. Furthermore, there is a so-termed subcode channel which contains addresses in the form of so-termed absolute time codes. The data in the main channel are subdivided into blocks customarily referred to as sectors. Each sector comprises a so-termed sector header which contains, amongst other things, a sector address which corresponds to the absolute time code in the subcode channel, and a data portion which contains the actual user-supplied data. Prior to the data being recorded on the CD-ROM, these data are subjected to a CIRC process which makes error correction possible. In this process so-termed P-redundancy codewords and so-termed Q-redundancy codewords are added. Also, the data from the sector is distributed over a large portion of each recorded signal. The result of this distribution (also denoted interleaving) is that, when the signal is read out, the data of any particular sector will not be available until the time has elapsed that is necessary for reading the data signal portion over which the data words (and associated P and Q-redundancy codewords) for that sector have been distributed. Contrary to the data in the main channel, the data in the subcode channel is available nearly immediately. Therefore, for a rapid search on a record carrier for a sector having a specific address, the address data in the subcode channel are used. A drawback of recording a subcode channel, however, is that as a result the space available for recording in the main channel is reduced.

SUMMARY OF THE INVENTION

It is an object of the invention to provide a read device for a record carrier on which the blocks recorded on the record carrier can be searched rapidly without using a subcode channel.

Such a record carrier is characterized in that the data signal portions representing data words of each of the blocks and second-type codewords related thereto are distributed over a portion of the data signal whose length is smaller than the length of the data signal portion over which first-type codewords have been distributed which are related to the data words of the associated block.

As the length of the data signal portion over which the data words of a block are distributed is relatively small, the time necessary for accessing control words in the control portions of a block is relatively short. Even though all the available redundant data about control words of the control portion, which words might be received erroneously, has not yet arrived, these still (partly) uncorrected control words are generally sufficiently reliable to be used to search for blocks on the record carrier. The control portion preferably contains control words representing an address, but the invention is not restricted thereto. It is alternatively possible that the control portion, whether or not combined with the address data, contain other control data which it is desirable to be rapidly available during the reading operation.

A further embodiment of the record carrier is characterized in that the control portion contains codewords which have a predefined relation to control words in the control portion, so that types of errors in the control in the control portion can be detected in response to the control words and the added codewords.

Detection of erroneously received control words in the control portion is possible because of the added codewords, so that search procedures based upon erroneous control data can be avoided.

A read device according to the invention reads a data signal recorded on a record carrier. Such device comprises first and second error correcting means for correcting errors in the recorded data words in response to the added first and second-type code words, and decoding means for decoding the control portions of the blocks in response to control words that have at most been corrected in response to second-type code words.

BRIEF DESCRIPTION OF THE DRAWINGS

The invention will be further explained in the following with reference to the drawing FIGS. 1 to 4, in which.

DESCRIPTION OF THE PREFERRED EMBODIMENTS

Figures 1, 2:
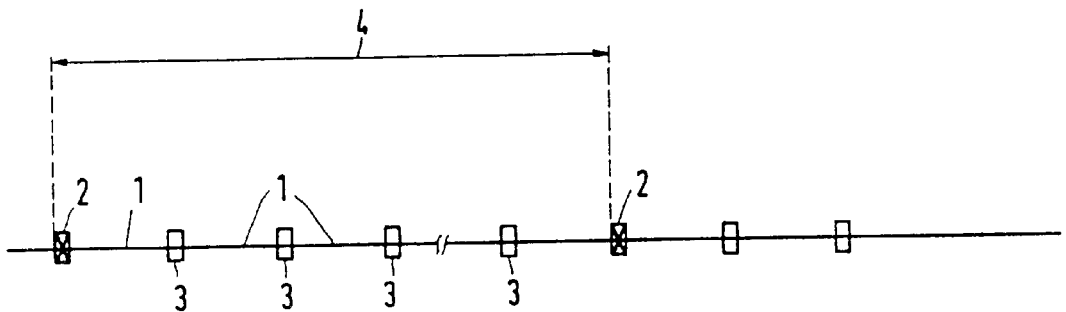
FIG. 1 shows a data signal.
FIG. 2 shows a format of the data signal.

FIG. 1 shows a data signal which is subdivided into blocks 1. Each of the blocks comprises a synchronization (sync) portion 2 or 3 and a data portion. The data portion comprises a number of n-bit data words. In the embodiment described here n is equal to 8. These n-bit data words will also be referenced (data) bytes. The blocks 1 are grouped in clusters 4 of q blocks. Possible values for q are, for example, 4 or 16. The data signal is intended to be recorded on a record carrier, for example, a record carrier of an optically detectable type. However, other types of record carriers, for example, a magnetic type, are likewise possible. Prior to being recorded, the data words are extended by redundancy codewords which make error correction possible. Subsequently, the data words and added redundancy codewords are converted to a modulated signal which has signal properties adapted to the type of record carrier on which the modulated signal is recorded. In the modulated signal the data words and added redundancy codewords are represented by a series of codes which uniquely determine the data words and code words. The conversion of data words and code words into a modulated signal may be as described in European Patent application No. 94200387.2 (PHN 14.746). Alternatively, however, other modulations such as, for example, a so-termed EFM modulation are likewise possible. The sync portions 2 and 3 in the modulated signal are preferably represented by codes not used for the data words and added codewords. Furthermore, it is preferable to use for the sync portions 2 accommodated in the first block of each cluster different codes from those used for the sync portions 3 of the other blocks of the cluster.

FIG. 2 shows in greater detail a preferred embodiment for a format of one of the signal blocks 1. In the format shown the bytes (data words) are grouped in rows of four bytes each. To the left of these rows is shown the serial number of the first byte of the row concerned. At the top the position of the bytes in the column is shown by the numbers "+0", "+1", "+2" and "+3". The first four byte positions, denoted "SYNC" in the format are intended for the sync portion 2 or sync portion 3. In addition to the SYNC portion the block comprises a control portion 20 (bytes "4" to "11" inc) and a data portion 21 (byte "12" up to and including the last byte of block 1). The control portion comprises three bytes which contain a sector address. The control portion may further comprise other control data, for example, as they are customarily included in the subcode channel on a Compact Disc. The bytes containing these data are referenced "Subcode". These bytes preferably comprise a byte denoting a so-termed Copy Right Class. The control portion further comprises a so-termed MODE byte which denotes the type of format. This MODE byte has a different value from the value used with CD-ROM.

The Pos_in_Cluster byte indicates the position of the relevant sector in a cluster.

Furthermore, it is preferable for the control portion 20 to comprise 20 CRC bytes. These bytes have a predefined relation to the other bytes in the control portion, so that detection of an erroneous transfer of the control portion bytes is possible. This relation may be one as described in detail in the textbook "THE ART OF DIGITAL AUDIO" by J. Watkinson (ISBN 0-240-51270-7).

The data portion 21 comprises a Sub-Header, for example, as used in the data blocks into which a CD-ROM or CD-I signal is divided. Furthermore the greater part of the data portion is formed by bytes containing the actual user-supplied data (User Data). The data portion 21 may further contain a number of bytes EDC which have a predefined relation to the other bytes in the data portion and which make a detection of erroneous data transfer possible.

In the format described hereinbefore, the boundary between the control portion 20 and the data portion 21 is selected such that the Sub-Header belongs to the data portion 21. The boundary may, however, as well be selected such that the Sub-Header belongs to the control portion 20.

Figure 3:
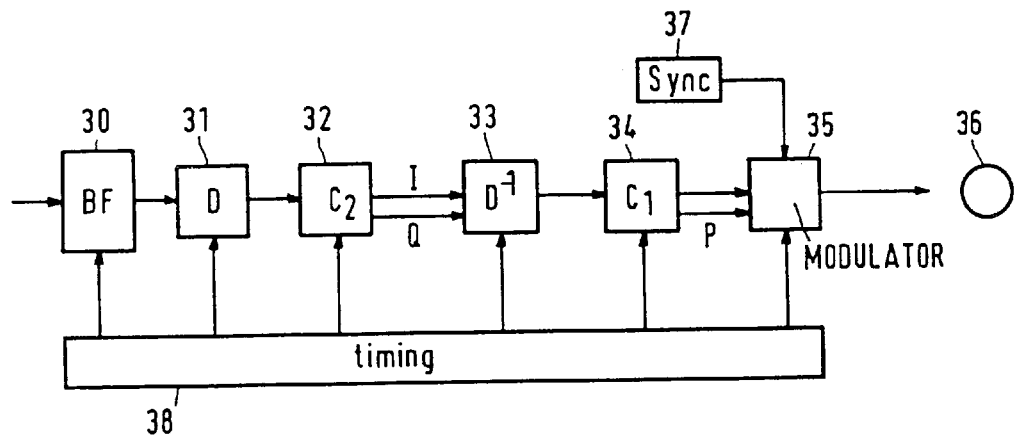
FIG. 3 shows a device for converting data to a modulated signal suitable for recording.

FIG. 3 shows an embodiment for a device by which a signal having the block format shown in FIG. 2 can be recorded on a record carrier. This device comprises a block formatter 30 formatting, in the format shown in FIG. 2 and in a customary fashion, the user-supplied data to be recorded. The whole block 1 is then formed except for the sync portion 2 or 3.

The blocks formed by the block formatter are applied to a so-termed interleaver of a customary type, which reorders the bytes of the blocks in that the bytes of the various blocks are interleaved. For a detailed description of such interleaving, reference be made to said title "THE ART OF DIGITAL AUDIO", more specifically, page 466. The interleaver 31 is followed by a $C_2$ encoder 32 which adds Q-redundancy bytes to the interleaved sequence of data bytes in a manner as described in chapter 7 of said textbook.

The interleaved data bytes and Q-redundancy bytes are applied to a deinterleaver 33 which reorders the interleaved data bytes and added Q-redundancy bytes in a manner in which the data bytes are put back in an order that corresponds to the order as it was on the output of the formatter 30. The Q-redundancy bytes which belong to data bytes of a sector are thereby distributed over a large area. The data bytes produced by the deinterleaver and Q-redundancy bytes are applied to a C1 encoder which adds to the received bytes so-termed P-redundancy bytes in a manner similar to the manner as described in chapter 7 of said textbook "THE ART OF DIGITAL AUDIO". The sequence thus obtained of data bytes and added Q-redundancy bytes and added P-redundancy bytes is applied into a modulator circuit 35 of a customary type which converts the received sequence of bytes to a modulated signal adapted to the properties of the type of record carrier on which the data are to be recorded. In addition, the modulator adds the sync portions 2 and 3 to the modulated signal. The sync portions 2 and 3 can be supplied to the modulator 35 by a generator 37. The modulator 35 may be of a customary type such as is known, for example, by the name of EFM modulator. However, this modulator may also be of a different type as described in European Patent application No. 94200387.2 (docket PHN 14.746). The modulated signal produced by the modulator 35 is recorded in customary fashion on a record carrier 36, for example, a disc-like record carrier of an optically detectable type on which the modulated signal is represented by an optically detectable data pattern.

For the purpose of synchronization of the signal processing operations, which are performed by the various parts of the device shown in FIG. 3, the device comprises a clock signal generator 38 generating clock signals for the various parts.

Figure 4:
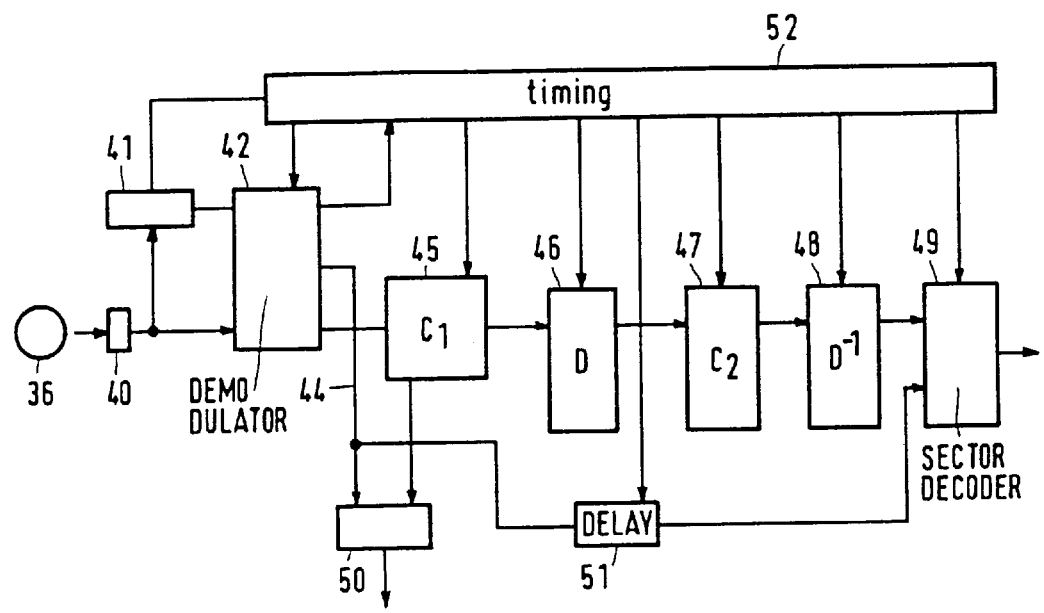
FIG. 4 shows a device for recovering data from a recorded signal read from a record carrier.

FIG. 4 shows a device for reading the data recorded on the record carrier. This device comprises a read head (not shown) which scans the data pattern available on the record carrier 36 and converts this pattern to a corresponding analog detection signal. The detection signal is applied to a so-termed slicer 40 which converts the analog detection signal to a corresponding binary read signal. The binary read signal is applied to a clock extraction circuit 41 for extracting a clock signal from the binary detection signal. The binary detection signal is further applied to a demodulation circuit 42 which reconverts the binary detection signal to a sequence of data bytes and P and Q-redundancy bytes. Besides, the demodulation circuit detects the sync portions 2 and 3. A signal denoting that a sync portion 2 or a sync portion 3 has been detected is fed to a signal line 44 by the demodulator 42. The data bytes and the added P and Q-redundancy bytes are applied to a circuit formed by a C1 decoder 45, an interleaver 46, a C2 decoder 47 and a deinterleaver 48, in this order. The interleaver 46 reorders the received bytes in a manner which is the reverse to the manner in which the bytes have been reordered by the deinterleaver 33 in FIG. 3. The deinterleaver 48 reorders the received bytes in a manner which is the reverse to the manner in which the bytes have been reordered by the interleaver 31 in FIG. 3. The C1 and C2 decoders detect and correct, in response to the P and Q-redundancy bytes, erroneously detected data bytes. The data bytes thus corrected are applied to a block deformatter 49 which separates the various types of data in the blocks and transfers these data to data processing arrangements (not shown). To simplify the establishment of the beginning of a block 1, the signal produced by the demodulator 42, which signal indicates that a sync portion 2 or 3 has been detected, is applied to the block deformatter via a time delay circuit 51 which delays the signal by a period of time corresponding to the delay of the circuit formed by the elements 45, 46, 47 and 48.

Furthermore, the device shown in FIG. 4 comprises a clock signal generator circuit 52 which produces a plurality of clock signals which are in synchronism with the clock signal extracted by the clock extraction circuit, and which synchronous clock signals are applied to the various elements of the device to synchronize the operations performed by these elements.

Due to the use of the interleaver 46 and the deinterleaver 48 which reversely reorders the data bytes, the order in which the data bytes are produced by the demodulator 42 corresponds to the order in which the corrected data bytes are produced by the deinterleaver 48. This means that on the output of the demodulator 42 the data bytes are produced for complete blocks 1 at a time. This is advantageous in that the data bytes of the control portion of a block 1, even though in uncorrected form, become available on the output of the demodulator 42 substantially immediately after the bytes following a sync portion 2 or 3 have been read out. This control portion contains data used for searching for blocks recorded on the record carrier 1. Due to this rapid availability it is thus possible to have a rapid search for a desired block 1 on the record carrier based on the data bytes available on the output of the demodulator 42.

The C1 decoder corrects single errors in response to the added P-redundancy bytes. Therefore, it is preferable to use the search control not the data bytes available on the output of the demodulator 42, but the data bytes corrected for single errors, which bytes become available on an output of the C1 decoder. For the purpose of the separation of the control portion, which portion is necessary for search control, the device comprises a circuit 50 which is supplied with both the signal denoting that a sync portion 2 or 3 has been detected by the demodulator and with the data bytes processed by the C1 decoder. The data separated by circuit 50 are transported to an arrangement (not shown) for search control of blocks 1 on the record carrier 36. It is preferable for having the circuit 50 comprise an error detector which detects, in response to the CRC bytes in the control portions 20 of the blocks 1, whether the received bytes in the control portions contain errors. In this manner the probability of an erroneously received signal being used for searching for blocks 1 on the record carrier 36 is reduced.

What is claimed is:

1. A device for reading a data signal recorded on a record carrier and which represents data words, added codewords (C2) of a first-type and added codewords (C1) of a second-type, the added codewords of the first type having a predefined first relation to the data words, the added codewords of the second-type having a predefined second relation to the data words combined with the added codewords of the first type; the first and second relations determining error correction of the data words in accordance with a predetermined algorithm; the data words in the recorded data signal being grouped into blocks which each comprise a control portion containing control data words representing control information and a data portion containing user-supplied data words; the second-type (C1) codewords applicable to the data words of a block being distributed over a portion of the data signal of shorter length than that over which the first-type codewords (C2) applicable to the data words of said block are distributed; said device comprising:

demodulating means for recovering blocks of data words and associated codewords from said data signal;

first error correcting means coupled to said demodulating means for correcting errors in the recovered blocks of data words based only on the second-type (C1) codewords associated therewith;

distributing means coupled to said first error correcting means for inverting the distribution of the first-type (C2) codewords so as to restore them to their original positions in relation to the data words in the corrected blocks produced by said first error correcting means;

second error correcting means coupled to said distributing means for correcting errors in the recovered blocks of data words based on the first-type (C2) codewords associated with said blocks; and decoding means coupled to one of said first and second error correcting means for separating control data words representing control information from the control portions of corrected blocks of data words produced by said one of said error correcting means.

2. A device as claimed in claim 1, wherein said decoding means is adapted to detect errors in the control data words which are separated from corrected blocks of data words.

3. A device as claimed in claim 1, wherein said decoding means is adapted to derive from control portions of data signal blocks sector addresses which are present in said control portions.

\* \* \* \* \*